United States Patent
Duerig et al.

(10) Patent No.: US 8,389,205 B2
(45) Date of Patent: Mar. 5, 2013

(54) PATTERNING NANO-SCALE PATTERNS ON A FILM COMPRISING UNZIPPING POLYMER CHAINS

(75) Inventors: Urs T. Duerig, Rueschlikon (CH); Jane E. Frommer, San Jose, CA (US); Bernd W. Gotsmann, Rueschlikon (CH); James L. Hedrick, San Jose, CA (US); Armin W. Knoll, Rueschlikon (CH); Robert D. Miller, San Jose, CA (US); David Pires, Rueschlikon (CH); Charles G. Wade, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 685 days.

(21) Appl. No.: 12/482,500

(22) Filed: Jun. 11, 2009

(65) Prior Publication Data

US 2010/0316960 A1    Dec. 16, 2010

(51) Int. Cl.
*G03F 7/26* (2006.01)
(52) U.S. Cl. ........................................ 430/322
(58) Field of Classification Search .............. 430/322, 430/330
See application file for complete search history.

(56) References Cited

U.S. PATENT DOCUMENTS

| | | | | |
|---|---|---|---|---|
| 5,225,314 A | * | 7/1993 | Waterman et al. | 430/253 |
| 5,952,457 A | * | 9/1999 | Kouno et al. | 528/408 |
| 2002/0177680 A1 | * | 11/2002 | Hubbell et al. | 526/286 |
| 2007/0114401 A1 | * | 5/2007 | King et al. | 250/309 |
| 2010/0196661 A1 | | 8/2010 | Duerig et al. | |

FOREIGN PATENT DOCUMENTS

| | | |
|---|---|---|
| JP | 2007220797 | 8/2007 |
| WO | WO2008114782 | 9/2008 |

OTHER PUBLICATIONS

Hua et al. "Direct Three Dimensional Nanoscale Thermal Lithography at High Speeds using Heated Atomic Force Microscope Cantilevers," Emerging Lithographic Technologies XI, (Mar. 2007), 6 pages.
Jegadesan et al "Easy Writing of Nanopatterns on a Polymer Film Using Electrostatic Nanolithography," Small, vol. 2, Issue 4, (Apr. 2006), pp. 481-484.
Kostler et al. "Amphiphilic Block Copolymers Containing Thermally Degradable Poly(phyhalaldehyde) Blocks," Wiley Interscience, (2008), 11 pages.
"International Technology Roadmap for Semiconductors," available at: http://www.itrs.net/Links/2007ITRS/Home2007.htm, last accessed Nov. 15, 2010, 1 page.
International Search Report for International Application No. PCT/IB2010/052618, 5 pages, (Sep. 28, 2010).
Written Opinion of the International Search Authority for International Application No. PCT/IB2010/052618, 11 pages, (Sep. 28, 2010).

(Continued)

*Primary Examiner* — Brittany Raymond
(74) *Attorney, Agent, or Firm* — Jeffrey T. Holman

(57) ABSTRACT

The invention concerns a method for patterning a surface of a material. A substrate having a polymer film thereon is provided. The polymer is a selectively reactive polymer (e.g. thermodynamically unstable): it is able to unzip upon suitable stimulation. A probe is used to create patterns on the film. During the patterning, the film is locally stimulated for unzipping polymer chains. Hence, a basic idea is to provide a stimulus to the polymeric material, which in turn spontaneously decomposes e.g. into volatile constituents. For example, the film is thermally stimulated in order to break a single bond in a polymer chain, which is sufficient to trigger the decomposition of the entire polymer chain.

17 Claims, 6 Drawing Sheets

OTHER PUBLICATIONS

Nyffenegger et al. "Nanometer-Scale Surface Modification Using the Scanning Probe Microscope: Progress since 1991." Chemical Reviews, vol. 97, No. 4, (1997) pp. 1195-1230.

Guthrie "Hydration of Carbonyl Compounds, an Analysis in Terms of Multidimensional Marcus Theory." Journal of the American Chemical Society, vol. 122, No. 23, (2000), pp. 5529-5538.

Aso et al. "Polymerization of Malealdehyde" Journal of Polymer Science Part B: Polymer Letters, vol. 4, No. 3, (Mar. 1966), pp. 171-174.

Aso et al. "Studies on the Polymerization of Bifunctional Monomers" Die Makromolekulare Chemie, vol. 84, (1965), pp. 126-136.

Zuman "Reactions of Orthophthalaldehyde with Nucleophiles" Chemical Reviews, vol. 104, No. 7, pp. 3217-3238, (2004).

Ito et al. "Chemical Amplification in the Design of Dry Developing Resist Materials," Technical Papers of SPE Regional Technical Conference on Photopolymers, (1982), pp. 331-353.

Tsuda et al. "Acid-Catalyzed Degradation Mechanism of Poly(phthalaldehyde): Unzipping Reaction of Chemical Amplification Resist." Journal of Polymer Science Part A: Polymer Chemistry, vol. 35, No. 1, (1997), pp. 77-89.

Aso et al. "Polymerization of Aromatic Aldehydes. II. Cationic Ayclopolymerization of Phthalaldehyde." Journal of Polymer Science: Part A-1: Polymer Chemistry, vol. 7, No. 2, (1969), pp. 497-511.

Ito et al. "Thermally Developable, Positive Tone, Oxygen RIE Barrier Resist for Bilayer Lithography." Journal of the Electrochemical Society, vol. 136, Issue 1, (Jan. 1989), pp. 245-249.

Ito et al. "Thermally Developable, Positive Resist Systems with High Sensitivity." Journal of the Electrochemical Society, vol. 136, Issue 1, (Jan. 1989), pp. 241-245.

Aso et al. "Polymerization of Aromatic Aldehydes. III. The Cyclopolymerization of Phthalaldehyde and the Structure of the Polymer" Macromolecules, vol. 2, Issue 4, (1969), pp. 414-419.

Yasuda et al. "Stereospecific Polymerization of o-Phthalaldehyde." Macromolecules, vol. 6, Issue 2, (1973), pp. 303-304.

Ito et al. "Chemical Amplification in the Design of Dry Developing Resist Materials." Polymer Engineering and Science, vol. 23, Issue 18, (Dec. 1983), pp. 1012-1018.

Degee et al. "New Catalysis for Fast Bulk Ring-Opening Polymerization of Lactide Monomers." Macromolecular Symposia, vol. 144, (1999) pp. 289-302.

Kamber et al. "Organocatalytic Ring-Opening Polymerization" Chemical Reviews, vol. 107, Issue 12, (2007), pp. 5813-5840.

Kobayashi et al. "Superacids and Their Derivatives. X. Mechanistic Studies of Selective Cyclodimerization of Ethylene Oxide by Superacid Ester Catalysts." Polymer Journal, vol. 11, No. 5, (1979), pp. 405-412.

Worsfold et al. "Cationic Polymerization of Ethylene Oxide. II. Boron Trifluoride." Journal of the American Chemical Society, vol. 79, Issue 4, (1957), pp. 900-902.

Culkin et al. "Zwitterionic Polymerization of Lactide to Cyclic Poly(Lactide) by Using N-Heterocyclic Carbene Organocatalysts" Angewandte Chemie International Edition, vol. 46, Issue 15, (2007) pp. 2627-2630.

Zhang et al. "Organocatalytic Stereoselective Ring-Opening Polymerization of Lactide with Dimeric Phosphazene Bases." Journal of the American Chemical Society, vol. 129, Issue 42, (2007), pp. 12610-12611.

Zhang et al. "Phosphazene Bases: A New Category of Organocatalysts for the Living Ring-Opening Polymerization of Cyclic Esters." Macromolecules, vol. 40, Issue 12, (2007) pp. 4154-4158.

Donovan et al. "A Novel Method for Determination of Polyester End-Groups by NMR Apectroscopy." Polymer, vol. 45, Issue 14, (Jun. 2005), pp. 5005-5011.

Jacobs et al. "Macromolecular Engineering of Polylactones and Polylactides. 5. Synthesis and Characterization of Diblock Copolymers Based on Poly-εcaprolactone and Poly(L,L or D,L)lactide by Aluminum Alkoxides." Macromolecules, vol. 24, Issue 11, (May 1991), pp. 3027-3034.

"International Technology Roadmap for Semiconductors: Executive Summary" available at: http://www.itrs.net/Links/2007ITRS/ExecSum2007.pdf, last accessed Mar. 16, 2010, 100 pages.

Rothschild "Projection Optical Lithography." Materials Today, vol. 8, Issue 2, (Feb. 2005), pp. 18-24.

Menon et al. "Maskless Lithography." Materials Today, vol. 8, Issue 2, (Feb. 2005), pp. 26-33.

Schifta "Nanoimprint Lithography: An Old Story in Modern Times? A Review." Journal of Vacumn Science Technology B, vol. 26 Issue 2, (Mar. 2008), pp. 458-480.

Resnick et al. "Step and Flash Imprint Lithography." Materials Today, vol. 8, Issue 2, (Feb. 2005), pp. 34-42.

Lapedus "Toshiba Claims to 'Validate' Nano-Imprint Litho." EE Times, available at: http://www.eetimes.com/showArticle.jhtml?articleID=202403251, last visited Mar. 16, 2010, 1 page.

Nyce et al. "Expanding the Catalytic Activity of Nucleophilic N-Heterocylic Carbenes for Transesterification Reactions." Organic Letters vol. 4, Issue 21, (2002), pp. 3587-3590.

Connor et al. "First Example of N-Heterocyclic Carbenes as Catalysts for Living Polymerization: Organocatalytic Ring-Opening Polymerization of Cyclic Esters." Journal of the American Chemical Society, vol. 124, No. 6, (2002) pp. 914-915.

Nyce et al. "In Situ Generation of Carbenes: A General and Versatile Platform for Organocatalytic Living Polymerization." Journal of the American Chemical Society, vol. 125, No. 10, pp. 3046-3056, (2003).

Coulembier et al. "Latent, Thermally Activated Organic Catalysts for the On-Demand Living Polymerization of Lactide." Angewandte Chemie International Edition, vol. 117, Issue 31, (2005), pp. 4964-4968.

Lohmeijer et al. "Organocatalytic Living Ring-Opening Polymerization of Cyclic Carbosiloxanes." Organic Letters, vol. 8, Issue 21, (2006), pp. 4683-4686.

Dove et al. "Thiourea-Based Bifunctional Organocatalysis: Supramolecular Recognition for Living Polymerization." Journal of the American Chemical Society, vol. 127, Issue 40, (2005), pp. 13798-13799.

Lohmeijer et al. "Guanidine and Amidine Organocatalysts for Ring-Opening Polymerization of Cyclic Esters." Macromolecules, vol. 39, Issue 25, (2006), pp. 8574-8583.

Pratt et al. "Triazabicyclodecene: A Simple Bifunctional Organocatalyst for Acyl Transfer and Ring-Opening Polymerization of Cyclic Esters." Journal of the American Chemical Society, vol. 128, Issue 14, (2006), pp. 4556-4557.

Kamber et al. "N-Heterocyclic Carbenes for the Organocatalytic Ring-Opening Polymerization of ε-Caprolactone." Macromolecules, vol. 42, Issue 5, (2009), pp. 1634-1639.

Coulembier et al. "Probe-Based Nanolithography: Self-Amplified Depolymerization Media for Dry Lithography." Macromolecules, vol. 43, Issue 1, (2010), pp. 572-574.

"International Technology Roadmap for Semiconductors: Emerging Research Materials." available at: http://www.itrs.net/Links/2007ITRS/2007_Chapters/2007_ERM.pdf, last accessed Mar. 16, 2010, 52 pages.

* cited by examiner

PATTERNING NANO-SCALE PATTERNS ON A FILM COMPRISING UNZIPPING POLYMER CHAINS

FIELD OF THE INVENTION

The invention relates to the field of probe-based methods for patterning a surface of a material, such as scanning probe lithography (herein after SPL). In particular, it may be directed to high resolution patterning on a surface of a material, such as nano-scale patterns with feature sizes of e.g. less than 32 nanometers (nm).

BACKGROUND OF THE INVENTION

Lithography is a process for producing patterns of two dimensional shapes, consisting of drawing primitives such as lines and pixels within a layer of material, such as, for example, a resist coated on a semiconductor device. Conventional photolithography (also called optical lithography) is running into problems as the feature size is reduced, e.g. below 45 nm. These problems arise from fundamental issues such as sources for the low wavelength of light, photoresist collapse, lens system quality for low wavelength light and masks cost. To overcome these issues, alternative approaches are required.

Examples of such alternative approaches are known in the field of the so-called nanolithography, which can be seen as high resolution patterning of surfaces. Nanolithography refers to fabrication techniques of nanometer-scale structures, comprising patterns having one dimension typically sizing up to about 100 nm (hence partly overlapping with photolithography). Beyond the conventional photolithography, they further include such techniques as charged-particle lithography (ion- or electron-beams), nanoimprint lithography and its variants, and SPL (for patterning at the nanometer-scale). SPL is for instance described in detail in Chemical Reviews, 1997, Volume 97 pages 1195 to 1230, "Nanometer-scale Surface Modification Using the Scanning Probe microscope: Progress since 1991", Nyffenegger et al. and the references cited therein.

In general, SPL is used to describe lithographic methods wherein a probe tip is moved across a surface to form a pattern. Scanning probe lithography makes use of scanning probe microscopy (SPM) techniques. SPM techniques rely on scanning a probe, e.g. a sharp tip, in close proximity with a sample surface whilst controlling interactions between the probe and the surface. A confirming image of the sample surface can afterwards be obtained, typically using the same scanning probe in a raster scan of the sample. In the raster scan the probe-surface interaction is recorded as a function of position and images are produced as a two-dimensional grid of data points.

The lateral resolution achieved with SPM varies with the underlying technique: atomic resolution can be achieved in some cases. Use can be made of piezoelectric actuators to execute scanning motions with a precision and accuracy, at any desired length scale up to better than the atomic scale. The two main types of SPM are the scanning tunneling microscopy (STM) and the atomic force microscopy (AFM). In the following, acronyms STM/AFM may refer to either the microscopy technique or to the microscope itself.

In particular, the AFM is a device in which the topography of a sample is modified or sensed by a probe mounted on the end of a cantilever. As the sample is scanned, interactions between the probe and the sample surface cause pivotal deflection of the cantilever. The topography of the sample may thus be determined by detecting this deflection of the probe. Yet, by controlling the deflection of the cantilever or the physical properties of the probe, the surface topography may be modified to produce a pattern on the sample.

Following this idea, in a SPL device, a probe is raster scanned across a functional surface and brought to locally interact with the functional material. By this interaction, material on the surface is removed or changed. In this respect, one may distinguish amongst:
  constructive probe lithography, where patterning is carried out by transferring chemical species to the surface; and
  destructive probe lithography, which consists of physically and/or chemically deforming a substrate's surface by providing energy (mechanical, thermal, photonic, ionic, electronic, X-ray, etc.).

SPL is accordingly a suitable technique for nanolithography.

High resolution patterning of surfaces is relevant to several areas of technology, such as alternatives to optical lithography, patterning for rapid prototyping, direct functionalization of surfaces, mask production for optical and imprint lithography, and data storage.

In particular, lithography can be used for the fabrication of microelectronic devices. In this case, next to conventional lithography, electron-beam (or e-beam) and probe-based lithography are mostly in use.

For high resolution optical mask and nano-imprint master fabrication, e-beam lithography is nowadays a standard technology. However, when approaching high resolutions, writing times for e-beam mask/master fabrication increase unfavorably.

As a possible alternative, the use of probes for such patterning is still under development. At high resolution (<32 nm), the speed of single e-beam and single probe structuring converges.

In the case of data storage, various approaches have been proposed to make use of probes for storage in the archival regime. However, a main challenge that remains is to achieve long bit-retention. Using thermomechanical indentation allows for instance to achieve satisfactory endurance and retention of data. A thermomechanical approach, however, produces indentations that are inherently under mechanical stress. Therefore it is difficult to obtain retention times in excess of ten years, as usually needed in the archival domain.

BRIEF SUMMARY OF THE INVENTION

In one embodiment, the present invention provides a probe-based method for patterning a material, comprising: providing a material having a polymer film comprising polymer chains, the polymer chains being able to unzip upon stimulation; and patterning the film with a nano-scale dimensioned probe, by stimulating the film for triggering an unzipping reaction of polymer chains of the film.

In other embodiments, the method may comprise one or more of the following features:
  the polymer film provided comprises polymer chains for which an energetic or chemical modification event triggers the unzipping reaction and wherein patterning includes stimulating the film such as that an energetic or chemical modification event occurs in at least one polymer chain;
  the polymer film provided comprises polymer chains which are able to unzip upon breaking one chemical bond thereof and wherein patterning includes stimulating the film such as to break one bond of at least one polymer chain;

patterning includes having the probe provide an energy to the film to activate a chemical reaction involving a reactant in proximity with polymer chains, the chemical reaction allowing in turn for unzipping at least one polymer chain;

the reactant is an acid-generator;

the polymer film is provided with the acid-generator comprised therein, the acid-generator being activated during patterning;

the acid-generator is dispensed by the probe during patterning;

the acid-generator is a thermal-acid-generator, the thermal-acid-generator activated by the probe, heated during patterning;

the acid-generator is a photo-acid-generator, the photo-acid-generator activated by light during patterning;

the film of the material provided comprises polyaldehydes;

the method further comprises, prior to providing, synthesizing the polymer such that polymeric chains have substantially the same length;

synthesizing the polymer comprises synthesizing a poly (phthalaldehyde);

synthesizing the poly(phthalaldehyde) polymer into block-copolymer;

polymerization is carried out with catalysts, the catalysts comprising N-heterocyclic carbenes;

polymerization is carried out with catalysts, the catalysts comprising dimeric phosphazene base 1-tert-butyl-2,2,4,4,4-pentakis(dimethylamino)-2$\Lambda$5,4$\Lambda$5-catenadi(phosphazene) (P2-t-Bu);

synthesizing the polymer is further carried out with a nucleophilic initiator;

the method further comprises terminating the synthesis of the polymer by quenching polymer chains; and patterning further comprises patterning a three-dimensional pattern of molecules in the film.

The invention can further be embodied, in another aspect, as a material comprising a polymer film, the film comprising polymer chains which can be unzipped upon stimulation; and nano-scale dimensioned patterns in the film, the patterns obtained according to the method of the invention.

According to yet another aspect, the present invention is embodied as a method of reading nano-scale dimensioned patterns in a polymer film of a material, comprising: providing a material according to the invention; and reading the patterns.

Methods and materials embodying the present invention will now be described, by way of non-limiting examples, and in reference to the accompanying drawings.

DETAILED DESCRIPTION OF THE INVENTION

As an introduction to the following description, general aspects of the invention focus on a method for patterning a surface of a material. A material having a polymer film thereon is provided. The polymer backbone is able to unzip upon suitable stimulation (energetic or chemical modification event, protonation, etc.). Typically, the polymer is chosen such that stimulating a first chemical modification or degradation event triggers an unzipping effect, partial or total. A probe is then used to create patterns on the film. During the patterning, the film is locally stimulated for triggering an unzipping reaction of polymer chains. As the unzipping effect is self-sustained, depolymerization is facilitated. Patterning a surface is accordingly made easier compared to prior art methods. Deep patterns can even be written with virtually no indentation force being applied to the probe tip. This minimizes pattern distortion resulting from indenting or displacing the material. Furthermore, polymeric chains can be made of arbitrary length which offers substantial flexibility in tuning the material properties such as the glass temperature and solvent resistance. An additional advantage is that no fine-tuning of intermolecular forces is required, at variance with materials requiring stabilization from secondary structure such as hydrogen bonds. For example, some of the polymer films as contemplated herein are not susceptible to water and solvent uptake, which may result in deteriorating the patterning properties. A variety of methods can furthermore be implemented for the activation of the intentional decomposition of such materials. For example, they can be thermally activated directly by the probe (energetic modification event). Alternatively, a chemical stimulus, e.g. a free proton from an acid generator included in the polymeric network, may serve this purpose.

More details shall be given now, in reference to the figures.

Figure 1:
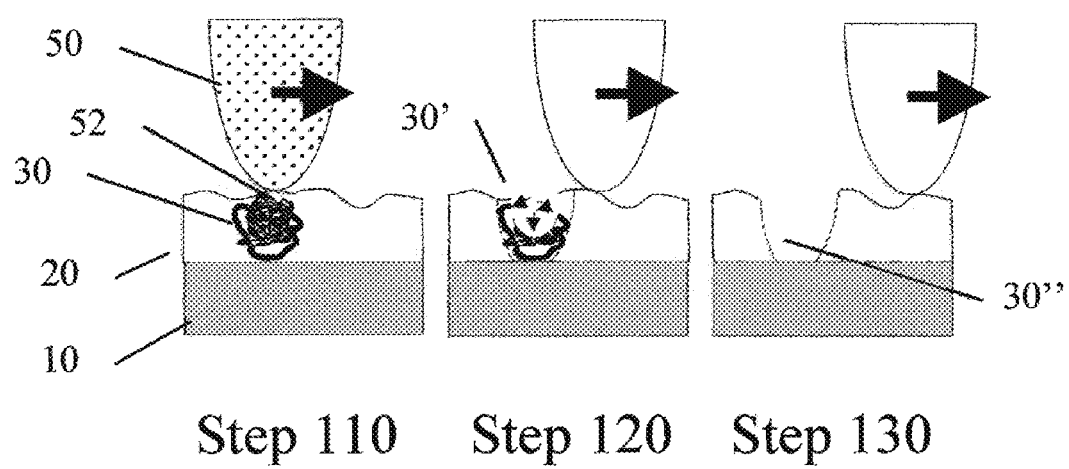
FIGS. 1-5 illustrate steps according to various embodiments of the method of the invention.

FIG. 1 illustrates steps of the method according to a first embodiment of the invention. In reference to FIG. 1, a material 10, 20 is provided, having a polymer film 20 on a substrate 10, where the film comprises the polymer chains 30. In FIG. 1, only one such chain 30 is depicted, for clarity. More will be said later about suitable polymers and how to obtain them.

The probe 50 is typically a SPM (e.g. AFM) probe mounted on the end of a cantilever. The probe may thus be part of an AFM device (not shown), comprising electronic circuitry suitably designed to measure and control, in operation, an interaction between the probe 50 and a sample surface 20.

Engineering solutions, which are known per se, may further be provided such that it is possible to accurately control the relative position of the probe and surface, and possibly to ensure good vibrational isolation of the SPM. This can for instance be achieved using sensitive piezoelectric positioning devices, as known in the art. Both vertical and horizontal controls of the probe are thus typically provided together with the SPM.

In a usual SPM device, the probe 50 is raster scanned above the sample surface, such that imaging of the surface topology can be carried out. Here, the probe is rather used primarily to engrave patterns on the surface of the film 20.

How the surface is patterned can be decomposed into several substeps.

Before patterning occurs properly, the probe 50 is maintained in a "non-patterning position", that is, close to the surface of the film 20 (not depicted). The probe is not yet in close enough contact to enable surface patterning.

In the embodiment of FIG. 1, a first substep 110 consists of stimulating the film 20 e.g. directly with the probe. Here an energy sufficient for the polymer to unzip is provided to the film, via an energetic modification event. In particular, the polymer can be chosen such that the energy provided suffices to break one bond of one or more polymer chains 30, as depicted in FIG. 1, step 110. In practice, the probe is put in close proximity to or in direct contact with the surface of the film 20 while being suitably heated. The force and the time of the exposure are tuned according to the polymer used in the film and the desired patterns.

As evoked, the polymer chains are able to unzip upon suitable stimulation, e.g. via an energetic or a chemical modification event. Such an event may for instance result in breaking a single chemical bond of the chain, which in turn triggers the unzipping reaction. This contrasts with polymers (e.g. polystyrene, poly-α-styrene) which would unzip if the polymer chain has enough thermal energy to decompose. Here, one broken bond suffices to trigger the unzipping effect. As the latter is self-sustained, less energy needs to be provided for the polymer to unzip during the patterning process.

The above principles are illustrated in steps 120 and 130 of FIG. 1. At step 120, degradation of a given polymer chain 30' begins. At step 130, the polymer chain 30'' is entirely degraded, e.g. into volatiles such as monomers. In other words, the polymer chain that was previously stimulated (step 110) has now disappeared. A clean patterned surface is accordingly obtained.

Figure 6:
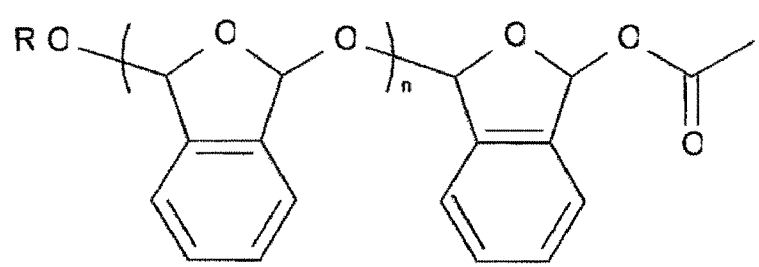
FIG. 6 represents the chemical structure of a poly(phthalaldehyde) polymer as used in embodiments of the present invention.

Briefly, a polymer suitable to implement the above principle is a poly(phthalaldehyde), whose chemical structure is depicted in FIG. 6. The present embodiment (i.e. FIG. 1) has for instance been successfully implemented with a poly(phthalaldehyde) having a molecular weight of approximately 27 kDa, corresponding to ~200 monomer units per molecule. As the obtained polymer is thermodynamically unstable at room temperature, the energetic cost of the patterning process is very much affordable. More shall be said in reference to FIGS. 6 to 8 below.

Figure 2:
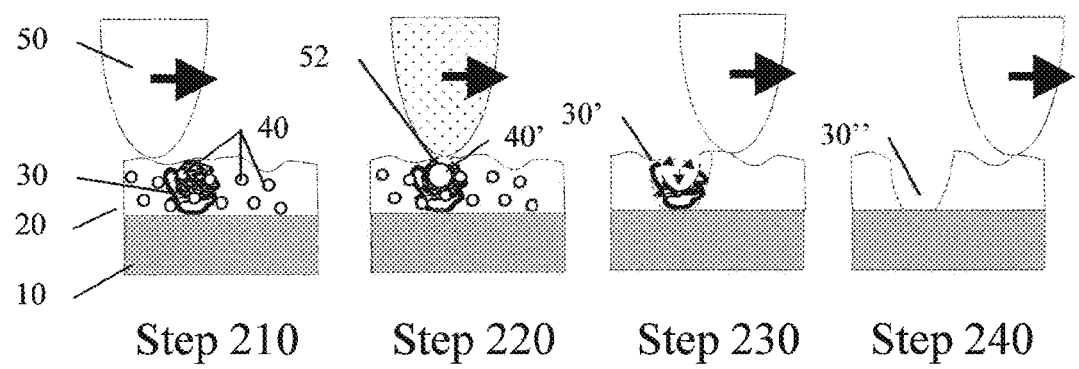

FIG. 2 is directed to another embodiment of the method according to the invention. Yet, it is similar to FIG. 1, except that the probe now provides to the film (step 220) an energy adapted to activate a chemical reaction 40'. Briefly, the chemical reaction involves a reactant 40, 40' in proximity with the polymer chains 30, whereby a chemical modification of one polymer chain likely occurs. This shall in turn allow for unzipping polymer chains 30, 30', 30''. The chain of causation is the following: a chemical reaction occurs; the chemical reaction triggers a chemical modification event (e.g. a degradation event) in a polymer chain; and the said event triggers the unzipping reaction. Hence, advantage is taken from the reaction to provide the energy necessary for triggering and possibly maintaining the unzip effect. However, the principle remains the same as in the embodiment of FIG. 1: the film is stimulated such that an unzipping reaction is triggered. Accordingly, less energy is needed to pattern the film.

For example, the reactant can be an acid-generator. Preferably, the polymer film 20 is provided with the acid-generator 40 comprised therein (e.g. immersed). Thus, the acid generator can be activated directly by the probe 50 or by a light pulse at the level of the probe when patterning. Here, the depolymerization reaction is induced by protonation, i.e. by the protons released upon activating the acid-generators immersed in the polymer melt. In other words, a chemical reaction relays and even amplifies an initial energy stimulus, to allow for the polymer chains to unzip.

The acid-generator may for instance be a thermal-acid-generator (TAG). The TAG molecules are thermally activated, e.g. by heating the probe as described in relation to FIG. 1. In this case, the probe 50 is heated, step 220, FIG. 2, in order to activate the TAG 40'. The result is substantially the same as what is obtained within the embodiment of FIG. 1. In a variant, the TAG molecules could also be activated by heating the entire sample. In another variant, an electrical stimulus could be used, relayed by the probe itself. Specific molecules known as squaric acid derivatives are particularly well suited to function as TAG.

Figure 3:
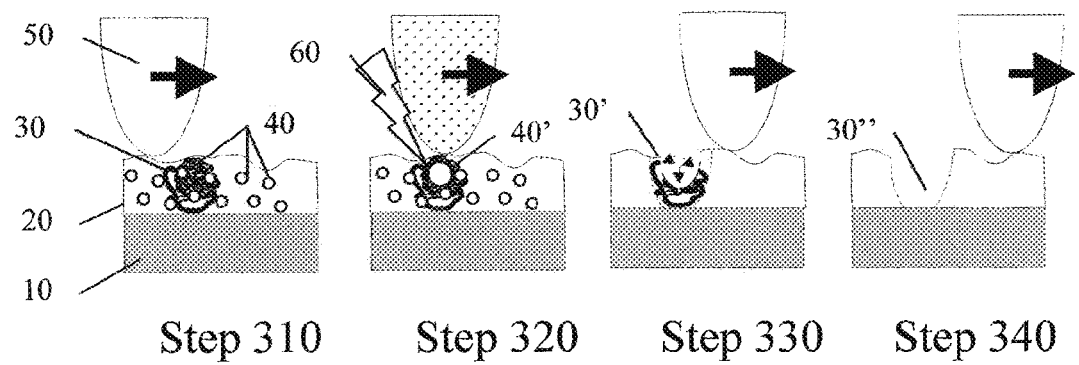

In the embodiment of FIG. 3, the acid-generator is a photo-acid-generator (PAG). In this case, the PAG is activated by light (e.g. by exposition to a light pulse 60), step 320, FIG. 3, in order to activate the PAG 40'. The light pulse may be provided by a source external to the probe 50. In a variant, the PAG molecules are activated by using the probe tip as a localized light source, as known from near-field-optical microscopy. The probe can be additionally heated in order to assist the activation of the PAG molecules and the depolymerization of the polymer chains.

Figure 4:
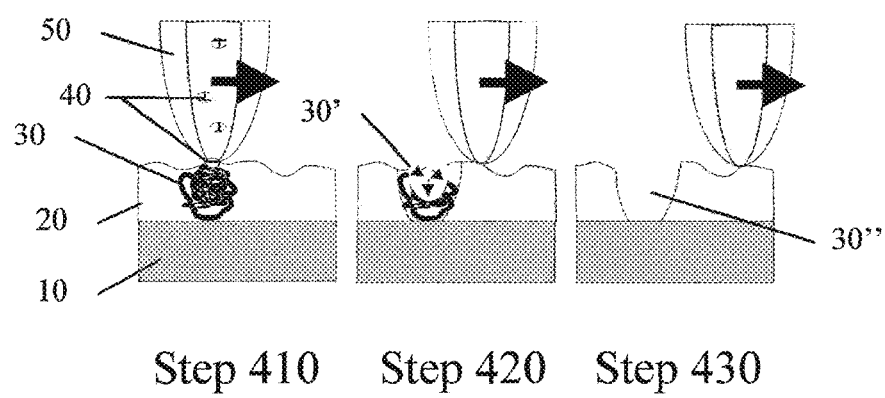

In further embodiments (FIGS. 4 and 5), the probe itself acts as a dispenser tool. Protons can for instance be provided in a native state in an acidic solution or in the form of TAG molecules dissolved in a suitable solvent, FIGS. 4 and 5.

The TAG molecules may be thermally activated i.e. by heating the dispenser probe as described above (step 410, FIG. 4). The TAG molecules could also be activated by heating the entire sample.

Figure 5:
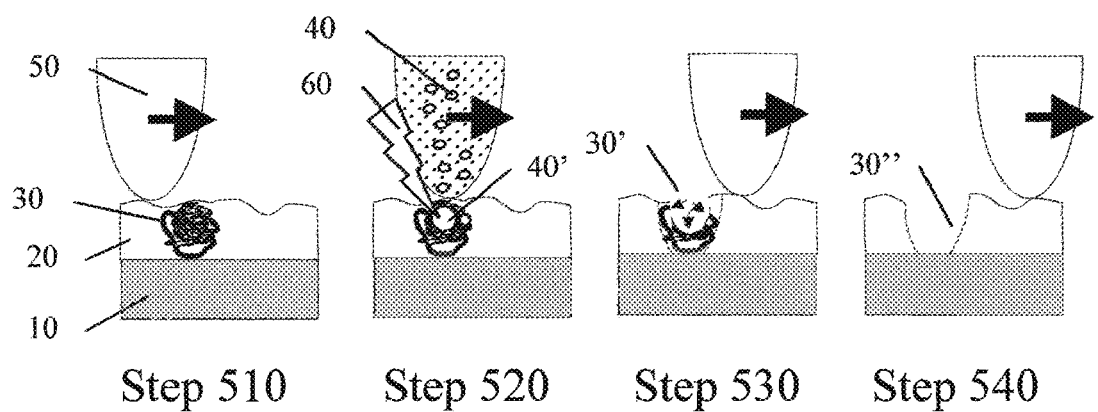

In the variant of FIG. 5, the probe is used to dispense PAG molecules which are activated by irradiating the sample with light 60 of suitable wave-length (typically in the ultraviolet range), as depicted in step 520.

In each of the above case, the film comprises polymers which are unstable under the operating conditions. Be it obtained by direct heating with the probe or induced protonation, the polymer chains are believed to unzip upon breaking one chemical bond of the chain. Thus, the polymer used is advantageously chosen amongst a class of polymers which unzip upon breaking one chemical bond thereof.

The polymer whose chemical structure is depicted in FIG. 6 is one such polymer. As said, the polymer comprises approximately n=200 monomer units equivalent to a molecular weight of 27 kDa.

The following describes a method for the living polymerization of poly(phthalaldehyde). The resulting polymer possesses a low ceiling temperature and further facilitates the ability to create permanent bits of data/patterns in a polymer media by selective thermolysis using a heated probe, as described e.g. in reference to FIG. 1.

A preferred strategy is to use a polymer medium that fully volatilizes on heating. Here a polymeric material is presented that has a low ceiling temperature and where one degradation event is amplified via an unzipping of the entire chain. It was shown that polyaldehydes are such a class of materials with a tunable degradation temperature. Despite many reports on the polymerization of aliphatic aldehydes, only few have been focused on aromatic aldehyde, e.g. benzyladehydes, since these monomers show a very limited reactivity towards nucleophiles. However, the polymerization of phthalaldehyde monomer has been accomplished using γ-ray irradiation, anionic, cationic and coordinative polymerization processes. It may be pointed out that none of these synthetic techniques provides predictable molecular weight, narrow polydispersities or end-group fidelity.

Figure 7:
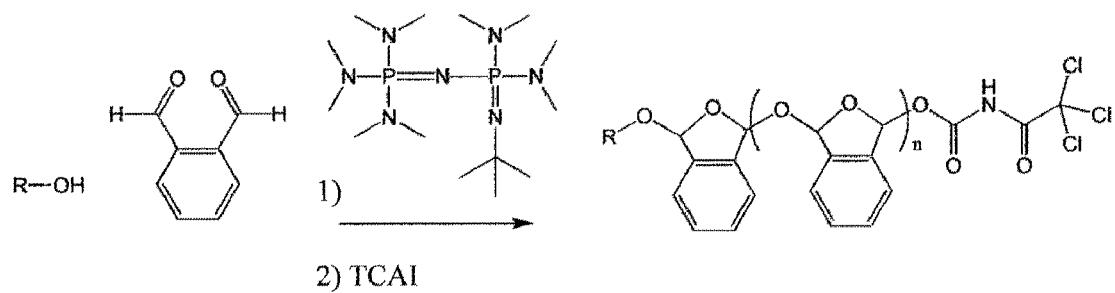
FIG. 7 is a possible reaction scheme for the polymerization of phthalaldehyde monomers.

Thus, efforts have focused on an organocatalytic approach to the polymerization of phthalaldehyde using dimeric 1-tert-butyl-2,2,4,4,4-pentakis(dimethylamino)-2$\Lambda^5$,4$\Lambda^5$-catenadi (phosphazene) ($P_2$-t-Bu) phosphazene base as an anionic catalysts in presence of an alcoholic initiator (see the scheme of FIG. 7, illustrating anionic cyclopolymerization of phthalaldehyde).

The polymerization of phthalaldehyde was carried out in Tetrahydrofuran (THF), −78° C., for 1 hour using benzyl alcohol or 1-pyrene butanol as initiators for two different monomer concentrations and different monomer to initiator to catalyst ratios (see Table 1).

The synthesis is terminated by quenching the polymer chains. In the present embodiment, polymerizations were quenched with trichloroacetyl isocyanate (TCAI), which reacts rapidly and quantitatively with hydroxyl chain ends, whereby polymer chains are end-group capped. All the more, this prevents depolymerization as the reaction returns to room temperature.

TABLE 1

Molecular characterizations of polyphthalaldehydes obtained after 1 hour in THF at −78° C. using alcohol (I) as initiator and $P_2$-t-Bu ($P_2$) as catalyst.

| Entry | $[M]_0/[I]_0/[P_2]_0$ | $[M]_0$ (mol/L) | Conv. (%)[b] | $Mn^c$ (g/mol) | PDI[c] |
|---|---|---|---|---|---|
| 1 | 200/1/1 | 0.7 | 73 | 10180 | 1.83 |
| 2 | 200/1/1 | 0.15 | 64 | 12070 | 1.67 |
| 3 | 200/1/0.5 | 0.7 | 90 | 36080 | 1.14 |
| 4 | 400/1/0.5 | 0.7 | 92 | 44400 | 1.12 |
| 5[a] | 600/1/0.5 | 0.7 | 93 | 153640 | 1.25 |

[a]Initiator = 1-pyrenebutanol,
[b]Determined by $^1$H NMR spectroscopy,
[c]Molecular weight and polydispersity index (PDI) as determined by gel permeation chromatography (GPC).

Clearly, lower catalyst and solution concentrations provided narrowly dispersed products, high conversions and predictable molecular weights. A comparison between the polyphthalaldehyde measured molecular weights ($M_n$GPC) and those calculated ($M_n$th=134.13*($[M]_0/[I]_0$*Conv(%))) (not depicted) further shows a linear fit to molecular weights up to 45,000 g·mol$^{-1}$, consistent with a living polymerization.

The GPC chromatograms show a Gaussian distribution of molecular weights for each sample, with PDI varying from 1.12 to 1.25, for the optimized conditions. The crude polymerization product of the polyphthalaldehyde initiated by 1-pyrenebutanol (Table 1, entry 5) shows the pyrene is symmetrically distributed throughout the sample (UV detector) and overlays with the data from the refractive index detector. The data obtained indicate a quantitative initiation of polymerization from the initiating alcohol allowing predictable molecular weights from the monomer-to-alcohol ratio and end-group fidelity. The preferred formation of the cis-microstructure (~60 mol %) supports an anionic polymerization process, supporting previous reports that $P_2$-t-Bu activates the initiating alcohol as the polymer-forming reaction. The decomposition temperature onset is ~150° C. and independent of molecular weight.

Supplemental information for the polymerization of poly (phthalaldehyde) follows.

First, concerning materials: phthalaldehyde (Benzene-1,2-dicarboxyaldehyde, >99% from Aldrich) has been purified by triple recrystallization from diethylether at −78° C. and dried under vacuum for 12 hours at room temperature. 1-Pyrenebutanol (99%, Aldrich) was dissolved in THF over $CaH_2$, filtered after an overnight stir, and collected by evaporation of the solvent. 1-tert-Butyl-2,2,4,4,4-pentakis(dimethylamino)-2$\Lambda^5$,4$\Lambda^5$ catenadi(phosphazene) THF solution (P2-t-Bu, ~2.0 mole/L, Fluka) was stirred over $CaH_2$ overnight, filtered and dried until obtaining of a brown viscous gel corresponding to dried P2-t-Bu. Benzyl alcohol (99.9%, J. T. Baker) was stirred over $CaH_2$ overnight and filtered prior to use. THF solvent was dried using an Innovative Technology PureSolv System (model SPS-400-5) equipped with alumina drying columns. Chloroform-d ($CDCl_3$, D 99.8%, Cambridge Isotope Laboratories, Inc.), 1,3-dimesitylimidazol-2-ylidene (IMes, StremChemicals) and trichloroacetyl isocyanate (TCAI, 97%, Aldrich) were used as received.

Second, concerning instruments: one-dimensional $^1$H (400 MHz) nuclear magnetic resonance (NMR) spectra were recorded on a Bruker Avance 400 instrument using a deuterated solvent ($CDCl_3$) as an internal standard. Gel permeation chromatography (GPC) was carried out with a Waters chromatograph calibrated with polystyrene standards (750–2× 10$^6$ g mol$^{-1}$) using THF as solvent. A Waters 410 differential refractometer and a 996 photodiode array detector were installed for detection. Four 5 μm Waters columns (300 mm×7.7 mm) with pore sizes of 10, 100, 1000, 10$^5$, and 10$^6$ Å were connected in series in the chromatograph.

Third, concerning the general procedure of phthalaldehyde polymerization using $P_2$-t-Bu as catalyst: in a previously dried schlenk flask equipped by a magnetical stirring bar, phthalaldehyde (200 mg, 1.5 mmol) and benzyl alcohol (0.8 μl, 7.46×10$^{-6}$ mol) were dissolved in THF (2 g). The schlenk flask is then thermostatized at −78° C. for one-to-two minutes. Previously prepared in a glove box, a solution of $P_2$-t-Bu (0.1 mg, 2.72×10$^{-7}$ mol) in 0.1 g of THF was added to initiate the polymerization using a previously dried syringe. After continuously stirring at −78° C. for 1 hour, the reaction was quenched by addition of TCAI and gently heated up to room temperature. (~2 hours). Thereafter, part of the solution was diluted with chloroform-d for NMR analysis to determine the conversion. The remaining solution was poured into a large excess of cool methanol to precipitate the poly(phthalaldehyde), which was then isolated by vacuum filtration. The obtained white solid was characterized by GPC (for molecular weight and polydispersity) and NMR (for degree of polymerization). $^1$H NMR ($CDCl_3$): 7.62-7.05 (m, 4 nH, aromatic), 7.05-6.7 (m, 2 mH-cis), 6.7-6.3 (m, 2pH-trans) [with n=m+p]. GPC (RI): Mn=36080 g·mol$^{-1}$, PDI=1.14.

Next, to demonstrate the properties of the material as a lithographic medium, a 50 nm thin film of the polymer was spun-cast on a silicon substrate and patterned using heated probes, as described in reference to FIG. 1. The probes are electrostatically actuated and heated with an integrated heater directly attached to the tip, as known per se. In the provided example, a 'pixel' was written by simultaneously applying a force and a heat pulse to the cantilever for 20 μs. A 700° C. tip-heater temperature was used, corresponding to elevating the polymer temperature to 300-400° C. As a result of the thermal activation, one or more chemical bonds in the polymer backbone will be opened (likely a small number). As soon as one bond in the polymer strand is broken, the entire molecule spontaneously disintegrates into its monomer units. The monomer units are highly volatile because of their low molecular weight (e.g. 134 Da). Whence, a fixed amount of material on the order of the volume occupied by one polymer molecule is removed whenever a bond is thermally broken. Very efficient material removal can thereby be obtained because the spontaneous depolymerization is much faster than the mean initiation rate of bond-breaking, governed by thermodynamic statistics.

Figure 8A:
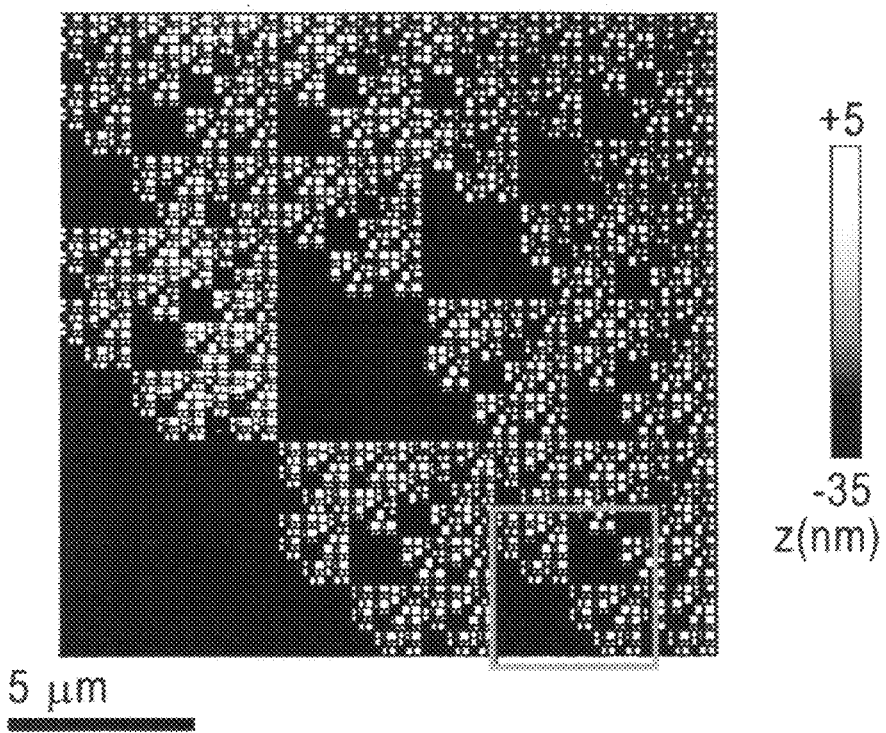
FIGS. 8.A-8.D aggregate results obtained according to an embodiment of the patterning method of the invention.
Figure 8B:
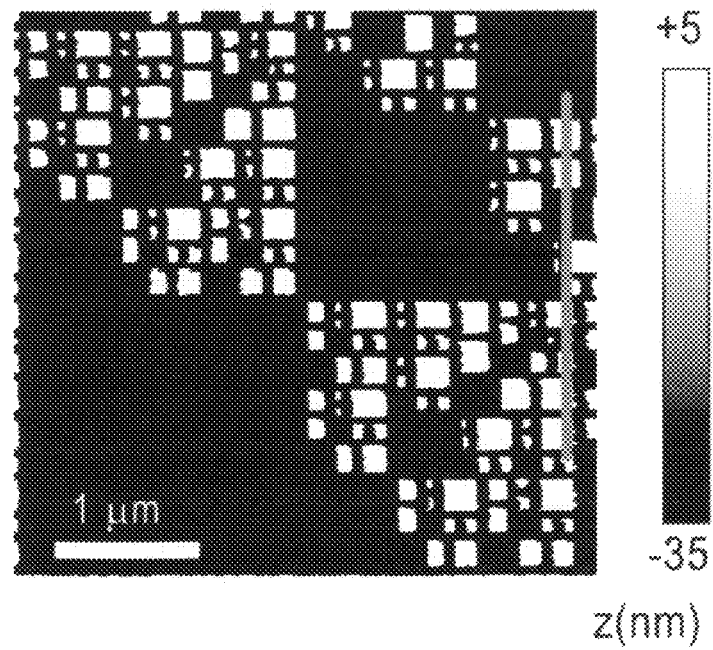

A fractal pattern, FIGS. 8A-B, has been chosen using a pixel size of 20 nm to demonstrate large area and high resolution patterning. FIG. 8A shows a topographic image. FIG. 8D shows the optical micrograph of the patterned 18×18 μm$^2$ area. The time between pixels was 60 μs (corresponding to a duty-cycle of ⅓) resulting in a total patterning time of ~3 minutes.

Figure 8C:
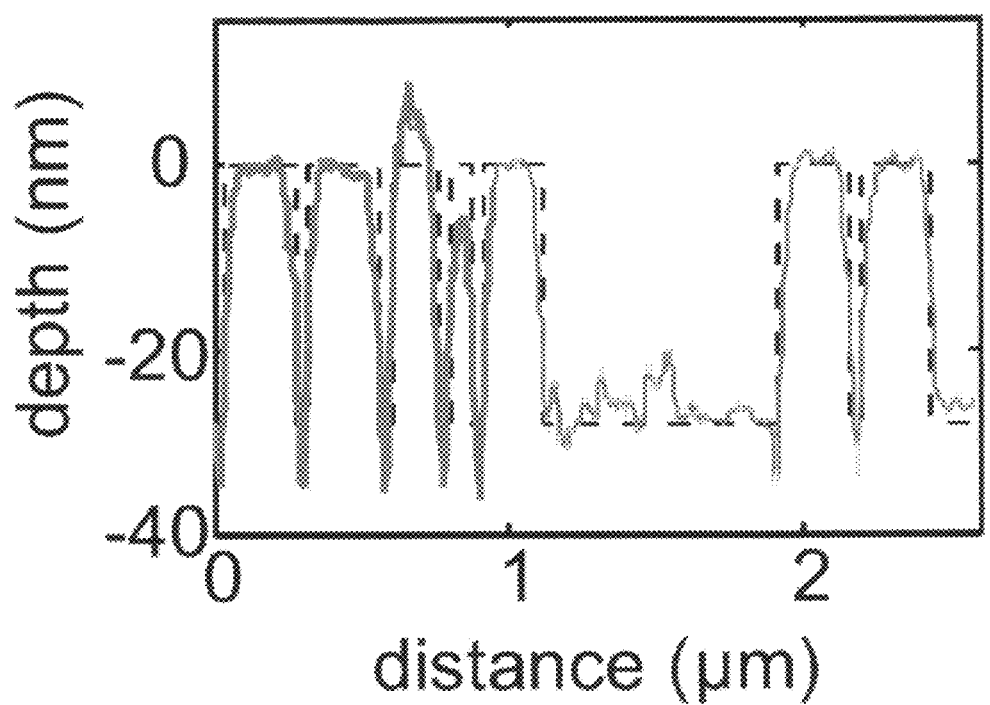
Figure 8D:
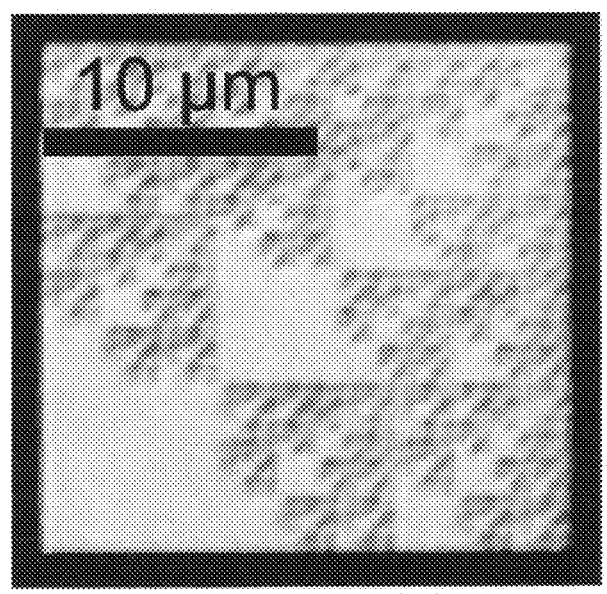

FIGS. 8B and 8C demonstrate the feature quality on a zoomed area of FIG. 8A (as denoted by the square, FIG. 8A, bottom right) through which a cross-section has been drawn as shown in FIG. 8C. A digital outline of the programmed input used to create the patterned surface is shown as a dashed line for comparison. No degradation in feature quality or patterning depth was observed over the patterned area.

Clearly a large volume of material has been removed from the surface. The patterning depth is uniform, showing a well-controlled and reproducible patterning event. A (low) applied force of 20±10 nN was sufficient to make conformal contact with the polymer surface. The indenter tip used has an apex radius of ~5 nm. The characteristics of the cantilever mount of the indenter are as follows: the spring constant is 0.1 N/m and the resonance frequency is 60 kHz. The clean removal of material at low applied forces indicates an effective triggering of the unzipping process of the polymer due to the contact with the hot tip. The resulting monomer constituents are effectively removed from the substrate, i.e. sufficiently heated by the tip to be evaporated.

The writing efficiency that can be achieved was demonstrated in a series of additional experiments. To this aim, the tip was heated to 650° C. and the load force varied between 7 nN and 9 nN. The duration of the heat and force pulses was typically 20 μs. Writing commences as soon as a minimum threshold load force of 6.5 nN is exceeded. Such a threshold allows for establishing good thermal contact between the hot tip and the polymer. At 7 nN load force, a permanent void is written with a depth of ~2 nm, which corresponds to the activation and subsequent depolymerization of one layer of polymeric strands at the surface of the film. Deeper voids can be written by increasing the load force, as illustrated above, which ensures that the load on the tip is always above the threshold force as the indenter sinks deeper into the polymer in the process of writing.

In addition, by e.g. scanning the tip and repeating the writing in a pixel-wise fashion, any arbitrary pattern can be engraved into the polymer film.

For example, using a load force of 20±10 nN, a pattern depth of 25 nm can be obtained. A total applied force of 20±10 nN is very low and just a few times higher than the force needed to nondestructively image the surface, i.e., to actuate the tip over the depth of 25 nm:3 nN in this case.

The depth of the pattern can furthermore be controlled by e.g. varying the load force, which allows one to engrave 3-D structures. Alternatively, 3-D patterning is also obtained by the superposition of layers which are written in sequence. For example, in a first step, the pattern is written using a load force of 15 nN, a heater temperature of 700 C, and a write pulse length of 20 μs, resulting in a depletion of the written surface by 14 nm. In subsequent steps, the same pattern is written within the previously written pattern, using identical writing conditions and each time reducing the lateral scale by a factor of two. The vertical position of the tip is adjusted with respect to the embedding trough depth prior to writing. The subsequent writing steps resulted in an additional surface depletion by 11 nm on average per writing step. The writing fidelity can further be demonstrated. In the present case, the root mean square roughness of the patterned surfaces is on the order 3 nm for all three patterning steps.

As suggested above, a confirming image of the sample surface can be obtained by reading patterns on the obtained surface. This is typically achieved by using the same probe as for patterning. As explained earlier, the probe-surface interaction is recorded as a function of position and images are produced as a two-dimensional grid of data points.

In conclusion, the experimental results discussed above notably demonstrate the possibility for a low temperature, organocatalytic method to create polyphthalaldehydes of predictable molecular weights and narrow polydispersities, which show to be ideal candidates as a lithographic medium. Lithographic patterning was demonstrated in a debris-free polymer decomposition reaction (unzipping) triggered by the proximity of a heated probe. The process has been exploited to pattern large areas of a polymeric film with high throughput and resolution, demonstrating a low-cost, table top, nanoscale patterning method.

Finally, in a further variant, one may use poly(alpha-methylstyrene) instead of poly(phthalaldehyde). However, the latter is not as advantageous as poly(phthalaldehyde) in many respects (temperature, speed, effectiveness and contamination of both the probe tip and the media). Other polymers can be contemplated, be it amongst the polyaldehydes.

Also, in another variant, the polymer film can be synthesized into block-copolymers. Block-copolymers can be designed to yield highly ordered films when deposited on a substrate (like Si). The resulting molecular order can accordingly be exploited for increasing the patterning resolution and fidelity.

While the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiment disclosed, but that the present invention will include all embodiments falling within the scope of the appended claims. For example, the present invention may be contemplated for various applications. While embodiments described above merely focus on uses for lithography (and data storage, implicitly), the skilled person may appreciate potential applications to pattern transfer of patterned regions into silicon.

What is claimed is:

1. A method for patterning a material, comprising
providing a material having a polymer film comprising polymer chains, the polymer chains being able to unzip upon stimulation;
dispensing a reactant from a nano-scale dimensioned probe to the polymer film, wherein the reactant comprises an acid-generator; and
patterning the film with the nano-scale dimensioned probe, by stimulating the film for triggering an unzipping reaction of polymer chains of the film.

2. The method of claim 1, wherein the polymer film provided comprises polymer chains for which an energetic or chemical modification event triggers the unzipping reaction and wherein patterning includes stimulating the film such that an energetic or chemical modification event occurs in at least one polymer chain.

3. The method of claim 1, wherein the polymer film provided comprises polymer chains which are able to unzip upon breaking one chemical bond thereof and wherein patterning includes stimulating the film to break one bond of at least one polymer chain.

4. The method of claim 1, wherein patterning includes having the probe provide an energy to the film to activate a chemical reaction involving the reactant in proximity with polymer chains, the chemical reaction allowing in turn for unzipping at least one polymer chain.

5. The method of claim 1, wherein the polymer film is provided with a further acid-generator comprised therein, the further acid-generator being activated during patterning.

6. The method of claim 1, wherein the acid-generator is dispensed during patterning.

7. The method of claim 1, wherein the acid-generator is a thermal-acid-generator, the thermal-acid-generator activated by the probe, heated during patterning.

8. The method of claim 1, wherein the acid-generator is a photo-acid-generator, the photo-acid-generator activated by light during patterning.

9. The method of claim 1, wherein the film of the material provided comprises polyaldehydes.

10. The method of claim 9, wherein synthesizing the polymer comprises synthesizing a poly(phthalaldehyde).

11. The method of claim 10, wherein synthesizing includes synthesizing the poly(phthalaldehyde) polymer into block-copolymer.

12. The method of claim 11, wherein a polymerization is carried out with catalysts, the catalysts comprising N-heterocyclic carbenes.

13. The method of claim 11, wherein a polymerization is carried out with catalysts, the catalysts comprising dimeric phosphazene base 1-tert-butyl-2,2,4,4,4-pentakis(dimethylamino)-2$\Lambda^5$,4$\Lambda$5-catenadi(phosphazene) ($P_2$-t-Bu).

14. The method of claim 13, wherein synthesizing the polymer is further carried out with a nucleophilic initiator.

15. The method of claim 13, further comprising terminating the synthesis of the polymer by quenching polymer chains.

16. The method of claim 1, further comprising, prior to providing, synthesizing the polymer such that the polymeric chains have substantially the same length.

17. The method of claim 1, wherein patterning further comprises patterning a three-dimensional pattern of molecules in the film.

* * * * *